(12) United States Patent
Knowles et al.

(10) Patent No.: US 9,983,234 B2
(45) Date of Patent: May 29, 2018

(54) NON-CONTACT MAGNETOSTRICTIVE CURRENT SENSOR

(71) Applicant: Qortek, Inc., Williamsport, PA (US)

(72) Inventors: Gareth J. Knowles, Williamsport, PA (US); William M. Bradley, Williamsport, PA (US); Jonathan M. Zook, Williamsport, PA (US); Ross Bird, Williamsport, PA (US); Safakcan Tuncdemir, Williamsport, PA (US)

(73) Assignee: QorTek, Inc., Williamsport, PA (US)

( * ) Notice: Subject to any disclaimer, the term of this patent is extended or adjusted under 35 U.S.C. 154(b) by 0 days. days.

(21) Appl. No.: 15/125,054

(22) PCT Filed: Mar. 10, 2015

(86) PCT No.: PCT/US2015/019778
§ 371 (c)(1),
(2) Date: Sep. 9, 2016

(87) PCT Pub. No.: WO2015/138505
PCT Pub. Date: Sep. 17, 2015

(65) Prior Publication Data
US 2017/0074906 A1    Mar. 16, 2017

Related U.S. Application Data

(60) Provisional application No. 61/950,815, filed on Mar. 10, 2014.

(51) Int. Cl.
*G01B 7/24* (2006.01)
*G01R 33/18* (2006.01)
(Continued)

(52) U.S. Cl.
CPC .......... *G01R 15/183* (2013.01); *G01L 1/2206* (2013.01); *G01R 15/18* (2013.01);
(Continued)

(58) Field of Classification Search
CPC .......... G01L 1/125; G01L 1/127; H01L 14/12
(Continued)

(56) References Cited

U.S. PATENT DOCUMENTS 3,504,282 A    3/1970 Opsahl et al.
6,781,285 B1   8/2004 Lazarus et al.
(Continued)

OTHER PUBLICATIONS

Zhang, J. et al. Enhanced sensitivity in magnetoelectric current-sensing devices with frequency up-conversion mechanism by modulating the magnetostrictive strain, Journal of Applied Physics 115, 17E505-1 to 17E505-3; Jan. 22, 2014[onlin]; [retrieved on May 13, 2015]; <URL:http://content.ebscohost.com>.

*Primary Examiner* — Reena Aurora
(74) *Attorney, Agent, or Firm* — Cahn & Samuels, LLP

(57) ABSTRACT

A non-contact, current sensor includes a gapped magnetic core configured to circumscribe a current carrying conductor. A magnetostrictive element is mechanically coupled to the gapped magnetic core. Current flowing in the current carrying conductor induces a magnetic field in the magnetic core that flows through the magnetostrictive element. The gapped magnetic core is provided with mounting sections to which the magnetostrictive element is mechanically coupled. The mounting sections have a geometry that increases magnetic flux in the magnetostrictive element. A strain gauge is mechanically coupled to the magnetostrictive element to measure displacement in the element induced by the magnetic flux.

16 Claims, 4 Drawing Sheets

(51) Int. Cl.
    *G01R 15/18*     (2006.01)
    *H01L 41/12*     (2006.01)
    *G01L 1/22*     (2006.01)
    *G01R 33/00*     (2006.01)
    *G01L 1/12*     (2006.01)

(52) U.S. Cl.
    CPC .......... *G01R 33/0052* (2013.01); *H01L 41/12* (2013.01); *G01L 1/127* (2013.01)

(58) Field of Classification Search
    USPC .............................................. 324/209, 117 R
    See application file for complete search history.

(56) References Cited

U.S. PATENT DOCUMENTS

| | | | |
|---|---|---|---|
| 6,809,515 B1 * | 10/2004 | Li | G01R 33/18 324/244 |
| 7,953,562 B2 * | 5/2011 | Bulte | G01L 1/125 702/42 |
| 2007/0241849 A1 | 10/2007 | Heinrich et al. | |
| 2008/0054881 A1 | 3/2008 | Kim | |
| 2009/0072822 A1 | 3/2009 | Sun et al. | |
| 2011/0192508 A1 | 8/2011 | Gao et al. | |

* cited by examiner

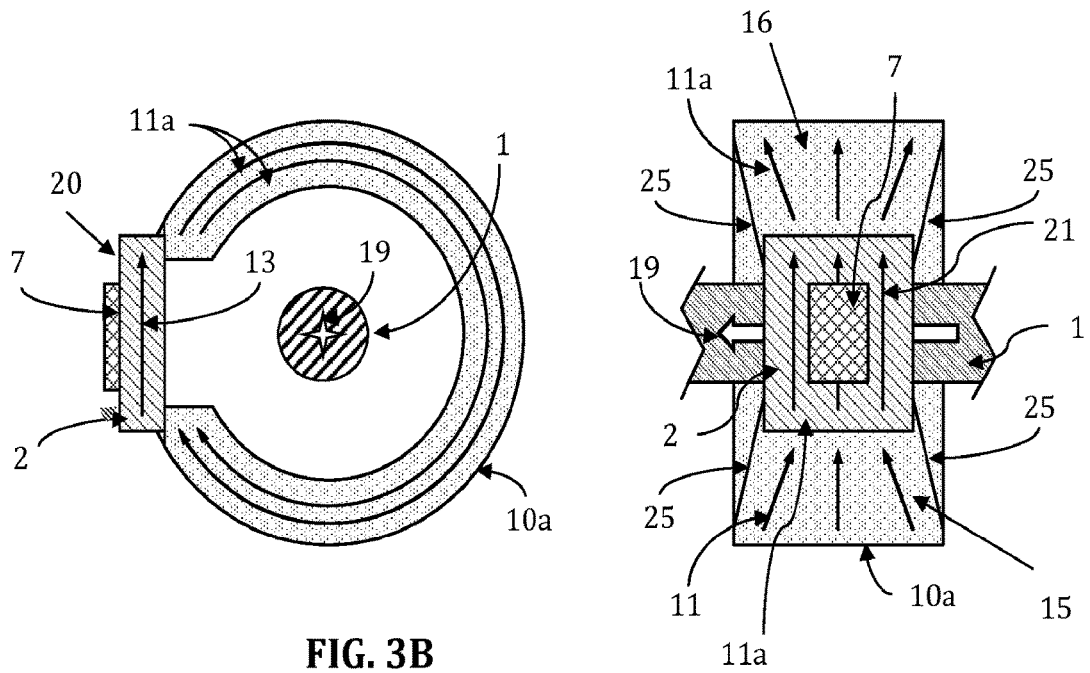
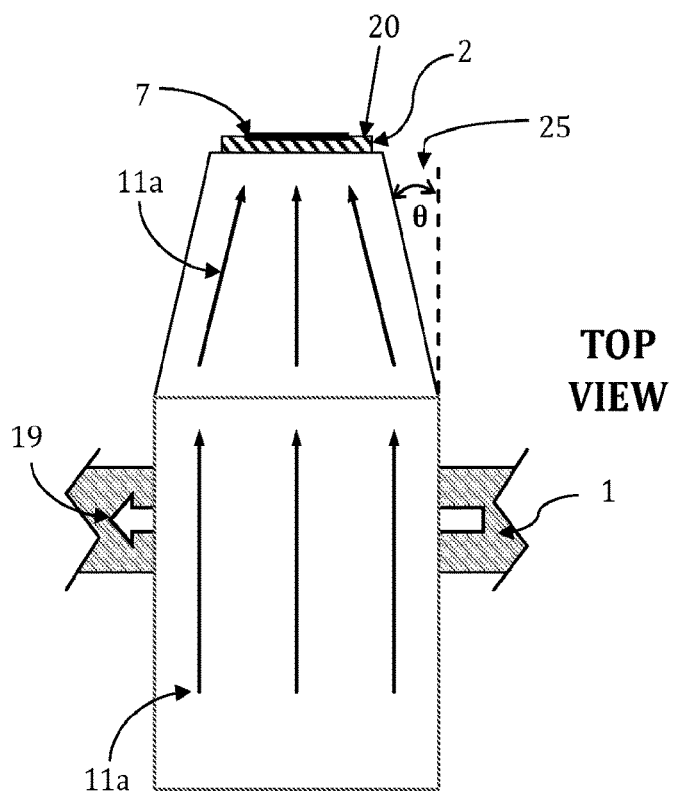
FIG. 3B
FIG. 3C
FIG. 3A

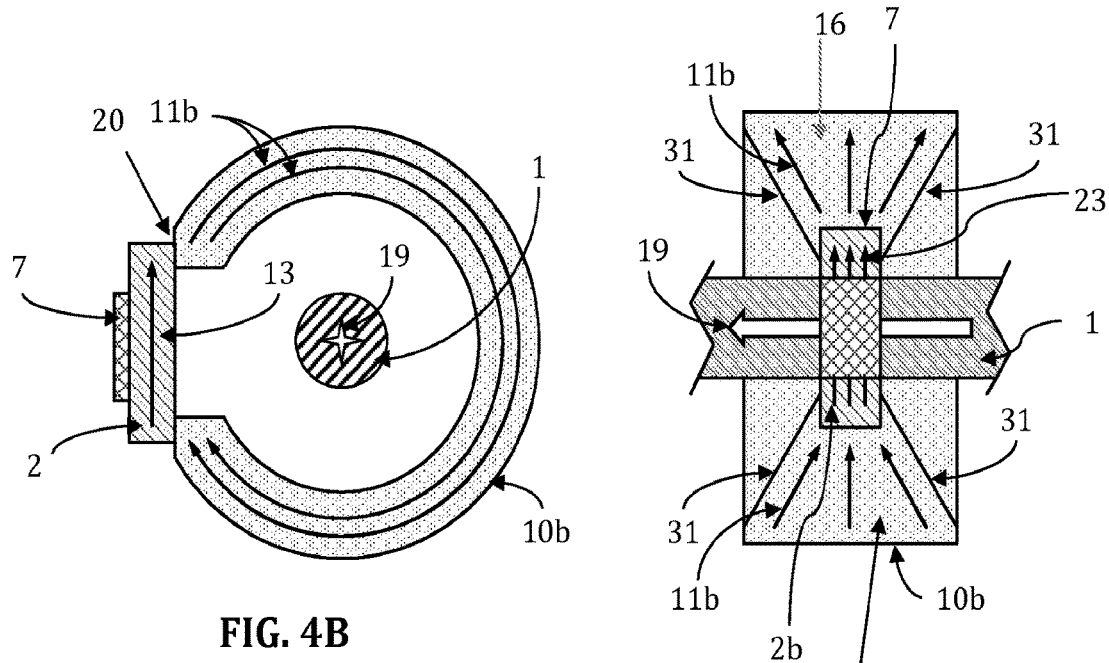
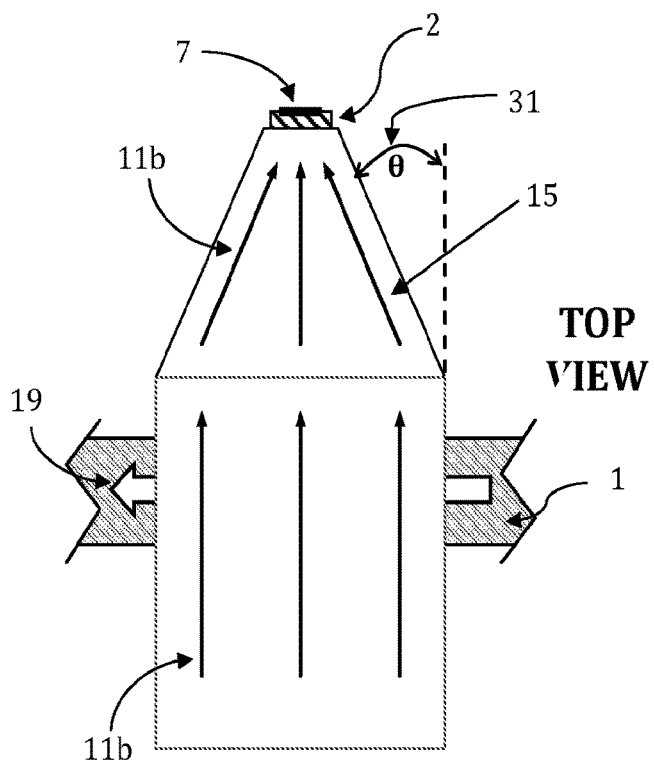
FIG. 4B
FIG. 4C
FIG. 4A

NON-CONTACT MAGNETOSTRICTIVE CURRENT SENSOR

This application claims the benefit of U.S. provisional Application Ser. No. 61/950,815, filed Mar. 10, 2014, and entitled Non-Contact Magnetostrictive Current Sensor which is incorporated herein by reference.

I. FIELD OF THE INVENTION

The present invention relates to methods and devices for non-contact current sensing using magnetostrictive materials.

II. BACKGROUND TO THE INVENTION

Current signal monitoring is particularly challenging. Although Hall effect sensors are closed-loop, more typically current measurement methods are open loop. Present methodologies used for current measurement fall into four main categories: resistive shunt, current transformer, Hall effect (Lorentz force), and giant magnetoresistive (GMR). Each of these approaches has practical difficulties and limitations. Table 1 summarizes some of the issues encountered for each of these approaches:

TABLE 1

Current Measurement Challenges in the Space Environment

| Resistive Shunt | Current Transformer | Hall Effect | GMR |
|---|---|---|---|
| No electrical isolation | Cannot measure DC current* | Requires temperature dependent offset compensation | Requires control of the geometry* |
| High acquisition cost | Produces AC insertion loss | Requires external power supply | Amplification circuit stage required |
| Insertion loss | Output is frequency dependent | Complex operation | Issues with common mode rejection |
| Large size/weight penalty for any measurement >100 Hz | Very large size/weight penalty for any significant power level measurement | Limited thermal range & low thermal drift | Nonlinear output response |
| Requires invasive insertion (line resistance/power loss | Requires EMI/RFI isolation packaging | High weight penalty (up to 2000 Kg) | Noise susceptibility |
| Amplification stage required | | | Lack of robustness |
| Difficult to install | | | |

*Zero-flux current transformer can measure to do but is designed for high power applications
*Low currents detection normally requires that the observed current flow into trace on the GMR chip located immediately over the GMR (Wheatstone bridge) resistors.

There has been additional work on solid-state solutions such as magnetodiodes (highly nonlinear and temperature dependent) and magnetotransistors (higher levels of noise, nonlinearity, temperature dependent, large offset values); however, their performance has prevented any commercial development to date. There has also been interest to exploit the Faraday effect for development of optical fiber based magnetic field sensors, but these are both complex and expensive to acquire, tricky to install, require optoelectronic conversion and are susceptible to 'latch-up in space environment.

For many applications installing a current sensor can becomes further challenging as the measurement solution may be required to exhibit high galvanic isolation, good accuracy, radiation effect tolerance, wide temperature operation and, critically, be capable of measuring both alternating current, even to very low frequencies, and measuring direct current. There is a need for a highly effective, compact, lightweight, low complexity current sensor, not subject to thermal effects, that can meet these needs.

One approach known to the present inventors is to exploit the properties of magnetostrictive materials. Magnetostrictive materials are materials that couple their magnetic and electric behaviors. In particular, the material will change shape when subjected to a magnetic field. Such materials include Terfenol and Galfenol. By placing a magnetostrictive element adjacent to a current carrying conduit the magnetic field caused by the flow of current will interact with the magnetostrictive material as to induce a strain ($\Delta L/L$). FIG. 1 shows a device where a cantilevered beam 4 with rigid support 5, whose free end is placed proximal to a current carrying cable 1 and has a magnetostrictive element 2 attached thereto. A piezoelectric element 3 is attached to one side of magnetostrictive element 2. When current 19 flows, Maxwell's equations state that it will induce a magnetic field which will cause an axial strain to occur in the magnetostrictive material 2. This strain is then transferred to the coupled piezoelectric element that, being piezoelectric, creates an electric potential. This voltage is proportional to the strength of the current flow 19 being monitored; however, the current flow induced strain in the magnetostrictive element is extremely small. It is known that the direct-effect dielectric constants of piezoelectric materials is low, so coupling the strain of the magnetostrictive insert to the piezoelectric material substantially reduces an already very small signal to where it becomes negligible and has to resolve noise and other measurement disturbance issues.

There remains a need for magnetostrictive based current sensing devices that induce a strain of sufficient magnitude in the magnetostrictive element per ampere of current flow to allow for measurement of a statistically significant range of current. There is also a need for magnetostrictive based current sensing device that exhibits minimal signal loss in conversion of induced strain on the magnetostrictive element.

III. SUMMARY OF THE INVENTION

The present invention presents a novel electrical current sensor capable of both direct current and alternating current measurements that provides for much larger change in resistance output signal per amp flow in the electrical cable or device to be monitored and that ensures that this increased signal strength is temperature independent. The invention utilizes a combination of magnetic, magnetostrictive, and resistive strain gauge materials to provide a proportional relationship between electrical current flowing in a cable or device to a change in electrical resistance.

In one embodiment, a magnetostrictive current sensor includes a magnetic core configured to surround a current carrying conductor. The magnetic core includes a gap disposed between first and second mounting sections. The first mounting section has a cross sectional area that decreases in the direction of a magnetic field induced by the conductor and the second mounting section has a cross sectional area that increases in the direction of the magnetic field. A magnetostrictive element is disposed in a path of a magnetic field and mechanically coupled to the mounting surfaces of the mounting sections. A strain gauge is mechanically coupled to the magnetostrictive element to measure the displacement of the magnetostrictive element induced by the magnetic field.

In another embodiment a method for manufacturing a magnetostrictive current sensor includes selecting a hollow magnetic core and forming a gap in that core. First and second mounting sections are then formed in the magnetic core. The first mounting section has a cross sectional area that decreases in a direction of an induced magnetic field and the second mounting section has a cross sectional area that increases in direction of the induced magnetic field. A magnetostrictive material is then bonded to the first and second mounting sections and a strain gauge is affixed to the magnetostrictive material.

IV. BRIEF DESCRIPTION OF THE DRAWINGS

FIG. 3A illustrates a top view of a current sensor in accordance with an embodiment of the invention.

FIG. 3B depicts a side view of the current sensor of FIG. 3A.

FIG. 3C shows a front view of the current sensor of FIG. 3A.

FIG. 4A depicts a top view of a current sensor in accordance with still another embodiment of the invention.

FIG. 4B illustrates a side view of the current sensor of FIG. 4A.

FIG. 4C shows a front view of the current sensor of FIG. 4A.

V. DESCRIPTION OF THE EMBODIMENTS OF THE INVENTION

The present invention is directed to magnetostrictive-based current sensors that measures the change in strain in a magnetostrictive element that results from a change in current flowing through a conductor. Electric currents in the current carrying conductor induce a magnetic field according to the 'right hand rule'. The magnetic field will be confined by any magnetic material such as ferrite that circumscribes the conductor as to form a closed magnetic circuit. As is known to those of skill in the art, a material is magnetostrictive when it engenders a coupling between magnetic energy and mechanical strain, the coupling phenomena being bidirectional. As such, the magnetic field will cause a strain to be generated within the magnetostrictive element in direction of the magnetic field. There is a significant portion of the strain vs. magnetic field response in magnetostrictive materials that is approximately linear.

Figure 1:
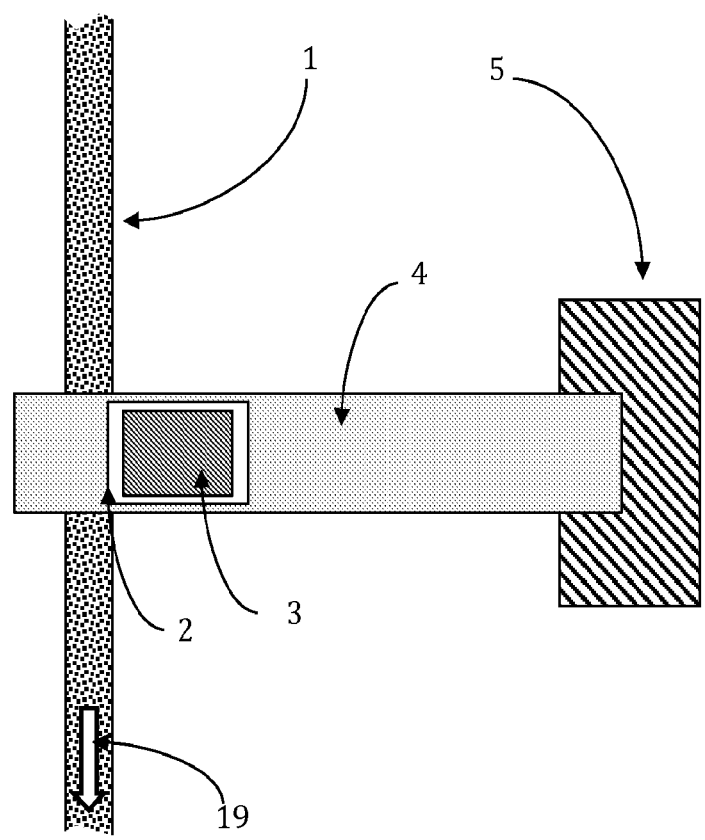
FIG. 1 shows a magnetostrictive current sensor known to the inventors.
Figure 2:
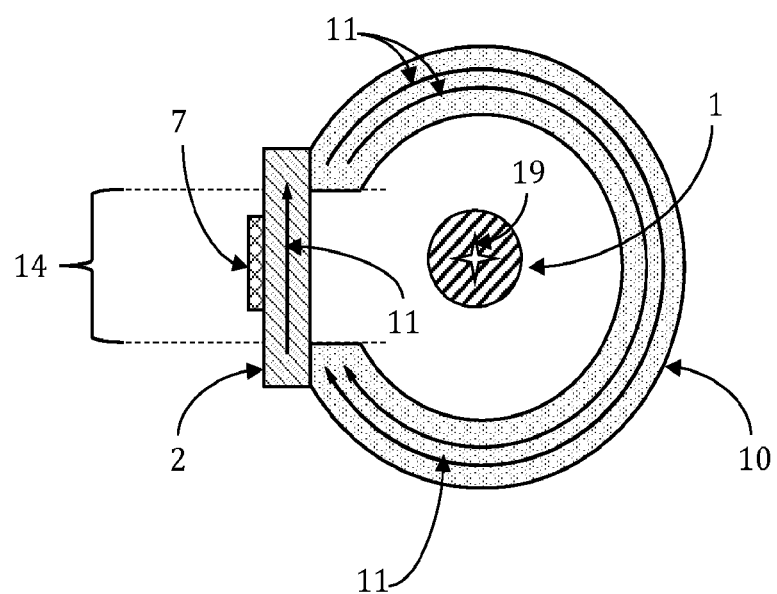
FIG. 2 shows the current sensor in accordance with an embodiment of the invention.

The invention is generally directed to a magnetostrictive current sensor including a gapped magnetic core 10 configured to circumscribe an electric conductor 1. As shown in FIG. 2, the current 19 in conductor 1 flowing into the page creates a magnetic field in magnetic core 10, in the direction represented by the arrows 11 that continues through magnetostrictive element 2. Magnetic core 10 includes a gap 14 and a magnetostrictive element 2 mechanically coupled to magnetic core 10 across gap 14. A strain gauge is mechanically coupled to the magnetostrictive element 2.

As shown in FIG. 2, a magnetostrictive element 2 is mounted to magnetic core 10 as to bridge gap 14. In keeping with an aspect of the invention, magnetostrictive element 2 is mounted to an exterior surface of magnetic core 10 to provide the geometry of magnetic core 10 at gap 14 and the size of magnetostrictive element 2 are selected to increase the magnetic flux density in the magnetostrictive element 2. Accordingly, the magnetic field 11 now forms a single unbroken path through the magnetic core 10 and magnetostrictive element 2. The magnetic field 11 induces a mechanical displacement in magnetostrictive element 2, which is proportional to the current 19 flowing in conductor 1.

In keeping with the invention, mounting magnetostrictive element 2 to an exterior surface of magnetic core 10 allows magnetostrictive element 2 to have nearly free strain characteristics in its longitudinal direction that aligns with the magnetic field 11 through magnetic core 10. Because magnetostrictive element 2 and magnetic core 10 have similarly high magnetic permeability they provide a low resistance path to contain the magnetic field 11. As such the field will travel from magnetic core 10 through magnetostrictive element 2 rather than through gap 14 thus providing a continuous closed magnetic circuit.

Increasing the flux density through magnetostrictive element 2 through gap geometry of magnetic core 10 will cause changes in the induced strain of magnetostrictive element 2. That is, the density of magnetic field 11 imparted on the magnetostrictive element 2 controls the ratiometric relationship between the amplitude of strain magnetic element 2 and the level of current flowing in the conductor 1. Concentration of magnetic field 11 in the region of the magnetostrictive element 2 respective to current flowing in the cable 1 provides direct control of current sensor 7 gain. Insufficient magnetic flux density in the magnetostrictive element 2 will cause mechanical strains that are inadequate for accurate measurement.

FIGS. 3A-3C illustrate a high sensitivity embodiment of a current sensor of the present invention. In FIGS. 3A-3C a large magnetostrictive element 7 is mechanically coupled to magnetic core 10a, that circumscribes conductor 1, with current 19, flowing into the page. Magnetic core 1 includes first and second mounting sections 15 and 16. First mounting section 15 has a cross sectional area that decreases in the direction of the magnetic field and the second mounting section 16 has a cross sectional area that increases in the direction of the magnetic field. In some embodiments, the first and second mounting sections are mirror images of each other. Each of the first and second mounting sections includes a generally planar mounting surface 20, 22 to which magnetostrictive element 2 is mechanically coupled. Magnetostrictive element 2 may be of sufficient size to cover substantially the entire surface area of generally planar mounting surfaces 20. As illustrated in FIG. 3C, the combination of large magnetostrictive element 2 and the geometry of mounting sections 15 and 16 causes a moderate flux density 21 within large magnetostrictive element 2, resulting in a moderate gain for the current sensor.

FIGS. 4A-4C illustrate a low sensitivity embodiment of a current sensor of the present invention. In FIGS. 4A-4C a small magnetostrictive element is mechanically coupled to magnetic core 10a, that circumscribes conductor 1, with current 19, flowing into the page. Magnetic core 1 includes first and second mounting sections 15 and 16. First mounting section 15 has a cross sectional area that decreases in the direction of the magnetic field and the second mounting section 16 has a cross sectional area that increases in the direction of the magnetic field. In some embodiments, first and second mounting sections are mirror images of each other. Each of the first and second mounting sections includes a generally planar mounting surface 20, 22 to which magnetostrictive element 2 is mechanically coupled. Magnetostrictive element 2 may be of sufficient size to cover substantially the entire surface area of generally planar mounting surfaces 20. As illustrated in FIG. 4C, the combination of small magnetostrictive element 2 and the geometry of mounting sections 15 and 16 causes a high flux density 23 within large magnetostrictive element 2, resulting in a high gain for the current sensor.

To measure the displacement or strain of magnetostrictive element 2, a strain gauge 7 is mechanically coupled thereto. FIG. 2 shows strain gauge 7 to a generally planar surface of the magnetostrictive element 2 with a high strength adhesive. In some embodiments, strain gauge 7 may be rigidly bonded to magnetostrictive element 2 as a weak or flexible bond will result in poor coupling between strain gauge 7 and magnetostrictive element 2. Strain gauge 7 exhibits a change in resistance proportional to the strain present within the magnetostrictive element 2, which is indicative of the current flowing in conductor 1. In some embodiments the strain gauge 7 can be configured in a Wheatstone bridge configuration in order to compensate for thermal drift present in the strain gauges. In other embodiments, strain gauge 7 may be of the foil type.

The invention embodies a method for measuring current using magnetostrictive devices. A current carrying wire is passed through a magnetic core such as magnetic core 10 and disposed such that the core surrounds the wire without touching the wire. The magnetic core focuses a portion of the magnetic flux from the wire into a small magnetostrictive element such as magnetostrictive element 2. The magnetic flux creates a displacement in the magnetostrictive element proportional to the current in the wire. The displacement of magnetostrictive element is measured using a strain gauge, such as strain gauge 7 which translates that displacement into resistance which may be used to calculate the current flow in the conductor.

The invention embodies a method for constructing magnetostrictive material based electrical current sensor. An air gap is machined into a closed magnetic core such as gap 14 in magnetic core 10. First and second mounting sections are formed in the magnetic core, each mounting section being provided with a generally planar mounting surface. A small magnetostrictive element is machined to dimensions slightly larger than the size of the air gap in the magnetic core. After the magnetostrictive element is formed, in some embodiments, is stress annealed in order to improve the general performance (magnetic field vs strain characteristics) of the device. A foil-type or Wheatstone bridge strain gauge capable of measuring strains in the range experienced by the magnetostrictive element is selected and bonded to the magnetostrictive element with high-strength adhesive or other attachment method to ensure adequate coupling between the magnetostrictive element strain and the gauge. The magnetostrictive element and bonded strain gauge are affixed to the magnetic core with a semi-flexible adhesive, such as in the assembly of FIG. 2. The semi-flexible adhesive allows the assembly to be structurally held in place without severely limiting the motion of the magnetostrictive element. Electrical connections are made to the strain gauge, and a current carrying conductor is passed through the magnetic core. As current in the conductor changes amplitude the resistance measured at the output will exhibit proportional changes, hence providing non-contact sensing capability. In accordance with aspects of the invention, while mounting sections 15 and 16 are illustrated as trapezoidal in FIGS. 3A-3C and 4A-4C, mounting sections 15 and 16 may comprise many different geometric formations.

Similarly, magnetostrictive element 2 may be of various sizes and geometries as long as adequate magnetic flux density is developed within the magnetostrictive element to be accurately measured with the coupled strain gauge. The magnetic core may be manufactured from a variety of possible magnetic materials or magnetic composites. The magnetic core so described may be toroidal but can also take other geometries, such as primarily square or ovoid, provided the core substantially encircles the conductor.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the root terms "include" and/or "have", when used in this specification, specify the present of stated features, integers, steps, operations, elements and/or components, but do not preclude the present or addition of at least one other feature, integer, step, operation, element, component, and/or group thereof.

The corresponding structures, materials, acts and equivalents of all means plus function elements in the claims below are intended to include any structure, or material, for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment discussed herein were chosen and described in order to best explain the principles of the invention and the practical application, and to enable others of ordinary skill in the art to understand the invention for various embodiments with various modifications are suited to the particular use are contemplated.

It will also be appreciated that various presently unforeseen or unanticipated alternatives, modifications, variations or improvements therein may be subsequently made by those skilled in the art, and are also intended to be encompassed by the following claims.

We claim:
1. A magnetostrictive current sensor comprising:
   a magnetic core configured to surround a current carrying conductor, said magnetic core including a gap disposed between first and second mounting sections, the first mounting section having a cross sectional area that decreases in a direction of a magnetic field and the second mounting section having a cross sectional area that increases in the direction of the magnetic field, each mounting section including a generally planar mounting surface;
   a magnetostrictive element disposed in a path of a magnetic field generated by said current carrying conductor and mechanically coupled to the generally planar mounting surfaces; and
   a strain gauge mechanically coupled to said magnetostrictive element.
2. The magnetostrictive current sensor of claim 1 wherein said magnetostrictive element is mechanically coupled to an exterior section of said magnetic core.
3. The magnetostrictive current sensor of claim 2 wherein said magnetostrictive element is of sufficient size to generally cover a surface area of the mounting surfaces.

4. The magnetostrictive current sensor of claim 3 wherein the magnetostrictive element comprises at least one of an iron gallium alloy, an iron terbium dysprosium alloy, and Terfenol-D.

5. The magnetostrictive current sensor of claim 3 wherein the magnetostrictive element is bonded to the mounting surfaces by a semi-flexible bond.

6. The magnetostrictive current sensor of claim 3 wherein said strain gauge is rigidly affixed to said magnetostrictive element.

7. The magnetostrictive current sensor of claim 2 wherein said magnetostrictive element is comprised of at least one of an iron gallium alloy, an iron terbium dysprosium alloy, and Terfenol-D.

8. The magnetostrictive current sensor of claim 2 wherein the magnetostrictive element is bonded to the mounting surfaces by a semi-flexible bond.

9. The magnetostrictive current sensor of claim 2 wherein said strain gauge is rigidly affixed to said magnetostrictive element.

10. The magnetostrictive current sensor of claim 1 wherein the magnetostrictive element is bonded to the mounting surfaces by a semi-flexible bond.

11. The magnetostrictive current sensor of claim 1 wherein said strain gauge is rigidly affixed to said magnetostrictive element.

12. The magnetostrictive element of claim 1 wherein said magnetostrictive element is comprised of at least one of an iron gallium alloy, an iron terbium dysprosium alloy, and Terfenol-D.

13. A method for manufacturing a magnetostrictive current sensor comprising:
    selecting a hollow magnetic core;
    forming a gap in the hollow magnetic core;
    forming first and second mounting sections in said magnetic core, the first and second mounting sections having a cross sectional area that increases in direction away from the gap;
    affixing a magnetostrictive element to the first and second mounting sections; and
    bonding a strain gauge to the magnetostrictive material.

14. The method of claim 13 wherein affixing the magnetostrictive material includes affixing the magnetostrictive element to said magnetic core with a semi-flexible adhesive.

15. A magnetostrictive current sensor comprising:
    a magnetic core configured to surround a current carrying conductor, said magnetic core including a gap disposed between first and second trapezoidal mounting sections, each mounting section including a generally planar mounting surface;
    a magnetostrictive element disposed in a path of a magnetic field generated by said current carrying conductor and mechanically coupled to the first and second trapezoidal mounting sections, said magnetostrictive element covering the surface area of the mounting surfaces of said first and second trapezoidal mounting sections such that the magnetic field traverses a single unbroken path through said magnetic core and said magnetostrictive element, said magnetostrictive element further including a generally planar mounting surface; and
    a strain gauge rigidly bonded to the mounting surface of said magnetostrictive element that exhibits a change in resistance proportional to the strain present with said magnetostrictive element.

16. The magnetostrictive current sensor of claim 15 wherein said magnetostrictive element covers the entire surface area of the mounting surfaces of said first and second trapezoidal mounting sections.

\* \* \* \* \*